(12) United States Patent
Myli et al.

(10) Patent No.: US 10,067,274 B2
(45) Date of Patent: Sep. 4, 2018

(54) NICKEL-ALUMINUM BLOCKER FILM LOW-EMISSIVITY COATINGS

(71) Applicant: Cardinal CG Company, Eden Prairie, MN (US)

(72) Inventors: Kari B. Myli, Sauk City, WI (US); Gary L. Pfaff, Cazenovia, WI (US); Daniel J. Plaggemeyer, Sauk City, WI (US)

(73) Assignee: CARDINAL CG COMPANY, Eden Prairie, MN (US)

( * ) Notice: Subject to any disclaimer, the term of this patent is extended or adjusted under 35 U.S.C. 154(b) by 274 days.

(21) Appl. No.: 15/241,593

(22) Filed: Aug. 19, 2016

(65) Prior Publication Data

US 2016/0356931 A1    Dec. 8, 2016

Related U.S. Application Data

(63) Continuation of application No. 14/663,577, filed on Mar. 20, 2015, now Pat. No. 9,469,566.

(51) Int. Cl.
| | |
|---|---|
| *B32B 15/04* | (2006.01) |
| *G02B 5/20* | (2006.01) |
| *C23C 14/35* | (2006.01) |
| *C03C 17/36* | (2006.01) |

(Continued)

(52) U.S. Cl.
CPC .............. *G02B 5/208* (2013.01); *C03C 17/36* (2013.01); *C03C 17/366* (2013.01); *C03C 17/3613* (2013.01); *C03C 17/3639* (2013.01); *C03C 17/3642* (2013.01); *C03C 17/3644* (2013.01); *C03C 17/3689* (2013.01); *C03C 17/3694* (2013.01); *C23C 14/35* (2013.01); *G02B 1/11* (2013.01)

(58) Field of Classification Search
USPC ....... 428/432, 434, 688, 689, 697, 699, 701, 428/702
See application file for complete search history.

(56) References Cited

U.S. PATENT DOCUMENTS

| | | | |
|---|---|---|---|
| 3,962,488 A | 6/1976 | Gillery | |
| 4,790,922 A | 12/1988 | Huffer | |
| 4,806,220 A | 2/1989 | Finley | |

(Continued)

FOREIGN PATENT DOCUMENTS

| | | |
|---|---|---|
| CN | 103072341 A | 5/2013 |
| EP | 1641722 A1 | 4/2006 |

(Continued)

OTHER PUBLICATIONS

International Patent Application No. PCT/US2016/021141, International Search Report & Written Opinion dated May 30, 2016, 10 pages.

(Continued)

*Primary Examiner* — Lauren R Colgan
(74) *Attorney, Agent, or Firm* — Fredrikson & Byron, P.A.

(57) ABSTRACT

The invention provides a glazing sheet and a low-emissivity coating on the glazing sheet. The low-emissivity coating comprises, in sequence moving outwardly from the glazing sheet, a layer comprising oxide film, nitride film, or oxynitride film, an infrared-reflective film, a nickel-aluminum blocker film, and an oxide film. Also provided are methods of depositing such a low-emissivity coating.

6 Claims, 6 Drawing Sheets

(51) Int. Cl.
*G02B 1/11* (2015.01)
*B32B 17/06* (2006.01)

(56) References Cited

U.S. PATENT DOCUMENTS

| | | |
|---|---|---|
| 4,966,676 A | 10/1990 | Fukasawa et al. |
| 4,976,503 A | 12/1990 | Woodard et al. |
| 5,189,551 A | 2/1993 | Woodard |
| 5,376,455 A | 12/1994 | Hartig et al. |
| 5,595,825 A | 1/1997 | Guiselin |
| 5,935,702 A | 8/1999 | MacQuart et al. |
| 6,033,536 A | 3/2000 | Ichihara et al. |
| 6,060,178 A | 5/2000 | Krisko |
| 6,231,999 B1 | 5/2001 | Krisko |
| 6,274,015 B1 | 8/2001 | Beier et al. |
| 6,432,545 B1 | 8/2002 | Schicht et al. |
| 6,555,250 B2 | 4/2003 | Shah et al. |
| 6,645,358 B2 | 11/2003 | Lupton et al. |
| 6,919,133 B2 | 7/2005 | Hartig et al. |
| 7,211,328 B2 | 5/2007 | Schicht et al. |
| 7,232,615 B2 | 6/2007 | Buhay et al. |
| 7,572,509 B2 | 8/2009 | Hartig |
| 7,572,510 B2 | 8/2009 | Hartig |
| 7,572,511 B2 | 8/2009 | Hartig |
| 8,088,473 B2 | 1/2012 | Hartig |
| 8,420,207 B2 | 4/2013 | Reutler et al. |
| 8,440,329 B2 | 5/2013 | Fleury et al. |
| 8,551,300 B2 | 10/2013 | Stachowiak |
| 8,586,215 B2 | 11/2013 | Hartig |
| 9,469,566 B2 | 10/2016 | Myli et al. |
| 2003/0180547 A1 | 9/2003 | Buhay et al. |
| 2004/0009356 A1 | 1/2004 | Medwick et al. |
| 2004/0247929 A1 | 12/2004 | Buhay et al. |
| 2005/0258029 A1* | 11/2005 | Muller .................. C03C 17/36 204/192.26 |
| 2008/0223718 A1 | 9/2008 | Takagi et al. |
| 2008/0280078 A1 | 11/2008 | Krisko et al. |
| 2009/0176086 A1 | 7/2009 | Martin et al. |
| 2010/0062245 A1 | 3/2010 | Martin et al. |
| 2012/0107587 A1 | 5/2012 | Martin et al. |
| 2012/0241316 A1 | 9/2012 | Arakawa |
| 2013/0032477 A1 | 2/2013 | Yamakoshi et al. |
| 2013/0120842 A1 | 5/2013 | Moens et al. |
| 2014/0268316 A1 | 9/2014 | Zhang et al. |
| 2014/0272454 A1* | 9/2014 | Zhang ................. C03C 17/3681 428/623 |
| 2015/0140355 A1* | 5/2015 | Suzuki .................... B32B 7/02 428/623 |

FOREIGN PATENT DOCUMENTS

| | | |
|---|---|---|
| WO | 2012115850 A1 | 8/2012 |
| WO | 2014017448 A1 | 1/2014 |
| WO | 2014109368 A1 | 7/2014 |
| WO | 2014164989 A1 | 10/2014 |
| WO | 2014185420 A1 | 11/2014 |

OTHER PUBLICATIONS

U.S. Publication No. 2016-0273264 A1, published Sep. 22, 2016, and identified hereby as being a related application.
U.S. Publication No. 2016-0273265 Al, published Sep. 22, 2016, and identified hereby as being a related application.
U.S. Appl. No. 14/663,644, Non-Final Office Action dated Feb. 27, 2017, 11 pages.
U.S. Appl. No. 14/663,644, Response to Non-Final Office Action filed May 2, 2017, 11 pages.
U.S. Appl. No. 14/663,644, Notice of Allowance dated Jul. 11, 2017, 8 pages.
U.S. Appl. No. 14/663,616, Non-Final Office Action dated Feb. 28, 2017, 12 pages.
U.S. Appl. No. 14/663,616, Response to Non-Final Office Action filed May 2, 2017, 11 pages.
U.S. Appl. No. 14/663,616, Notice of Allowance dated Jul. 6, 2017, 8 pages.
Partial English translation of International Patent Publication WO 2014/109368, published Jul. 17, 2014, 6 pages.
Machine translation of International Patent Publication WO 2014/109368, published Jul. 17, 2014, 8 pages.

* cited by examiner

NICKEL-ALUMINUM BLOCKER FILM LOW-EMISSIVITY COATINGS

FIELD OF THE INVENTION

The present invention relates to thin film coatings for glass and other substrates. In particular, this invention relates to low-emissivity coatings that are used on insulating glass units and other glazing assemblies. Also provided are methods and equipment for producing such coatings and glazing assemblies.

BACKGROUND OF THE INVENTION

Glass sheets and other substrates can be coated with a stack of transparent, metal-containing films to vary the properties of the coated substrates. Particularly desirable are coatings characterized by their ability to transmit visible light while minimizing the transmittance of other wavelengths of radiation, especially radiation in the infrared spectrum. These characteristics are useful for minimizing radiative heat transfer while controlling visible transmission. Coated glass of this nature is useful as architectural glass and as automotive glass.

Coatings having the characteristics of high visible transmittance and low emissivity typically include one or more infrared-reflective films and two or more antireflective transparent dielectric films. The infrared-reflective films reduce the transmission of radiant heat through the coating. The infrared-reflective films commonly are conductive metals (e.g., silver, gold, or copper), although transparent conductive oxides (e.g., ITO) or conductive nitrides (e.g., TiN) may also be used. The transparent dielectric films are used primarily to reduce visible reflection, to provide mechanical and chemical protection for the sensitive infrared-reflective films, and to control other optical coating properties, such as color. Commonly used transparent dielectrics include oxides of zinc, tin, and titanium, as well as nitrides and oxynitrides of silicon. Low-emissivity coatings can be deposited on glass sheets through the use of well-known magnetron sputtering techniques.

It is known to deposit a thin metallic layer directly over an infrared-reflective silver film to protect the silver film during deposition of a subsequent dielectric layer and/or during tempering or any other heat treatment. These protective layers (sometimes called "sacrificial layers" or "blocker layers") have been formed of various materials, such as titanium, niobium, niobium-titanium, or NiCr.

The particular material from which the blocker layer(s) is formed impacts various properties and characteristics of the coating. Titanium blocker layers, for example, have been found to impart excellent scratch resistance in low-emissivity coatings. They also adhere well to both an underlying silver film and an overlying oxide film. Niobium has been found to be an advantageous blocker layer material as well. In addition, niobium-titanium has been found to be particularly beneficial in certain respects.

It is sometimes necessary to heat coated glass sheets to temperatures at or near the softening point of glass (726 degrees C.), e.g., to temper the glass or enable it to be bent into desired shapes. Tempering is important for glass used in automobile windows, and particularly for glass used in automobile windshields, as well as in various architectural glazing applications. Upon breaking, tempered glass exhibits a break pattern in which the glass shatters into many small pieces, rather than into large dangerous shards. During tempering, coated glass is typically subjected to elevated temperatures on the order of about 700 degrees C. Moreover, the coated glass must be able to withstand such temperatures for substantial periods of time. Certain film stacks having silver as the infrared-reflective film are not able to withstand such high temperature processing without unacceptable deterioration of the silver film.

To avoid this problem, glass sheets can be heated (e.g., bent or tempered) before they are coated. The desired films can then be applied after heating. This procedure, however, tends to be complicated and costly and, more problematically, may produce non-uniform coatings.

In many cases, it is sufficient for temperable low-emissivity coatings to have only an upper blocker layer (i.e., without any lower blocker layer). In other cases, a reflective silver film is protected from deterioration at high temperatures by sandwiching the silver between two metallic blocker layers. In such cases, the two blocker layers are thick enough and reactive enough that when the coated glass is heated to high temperatures, these films capture oxygen and/or nitrogen that would otherwise reach and react with the silver.

It would be desirable to provide a low-emissivity coating based on a blocker layer material that can provide exceptional mechanical durability. It would be particularly desirable to provide a low-emissivity coating based on a blocker layer material that also provides exceptional moisture resistance, enables good control over optical properties (e.g., visible transmission), or both.

SUMMARY

Figure 1:
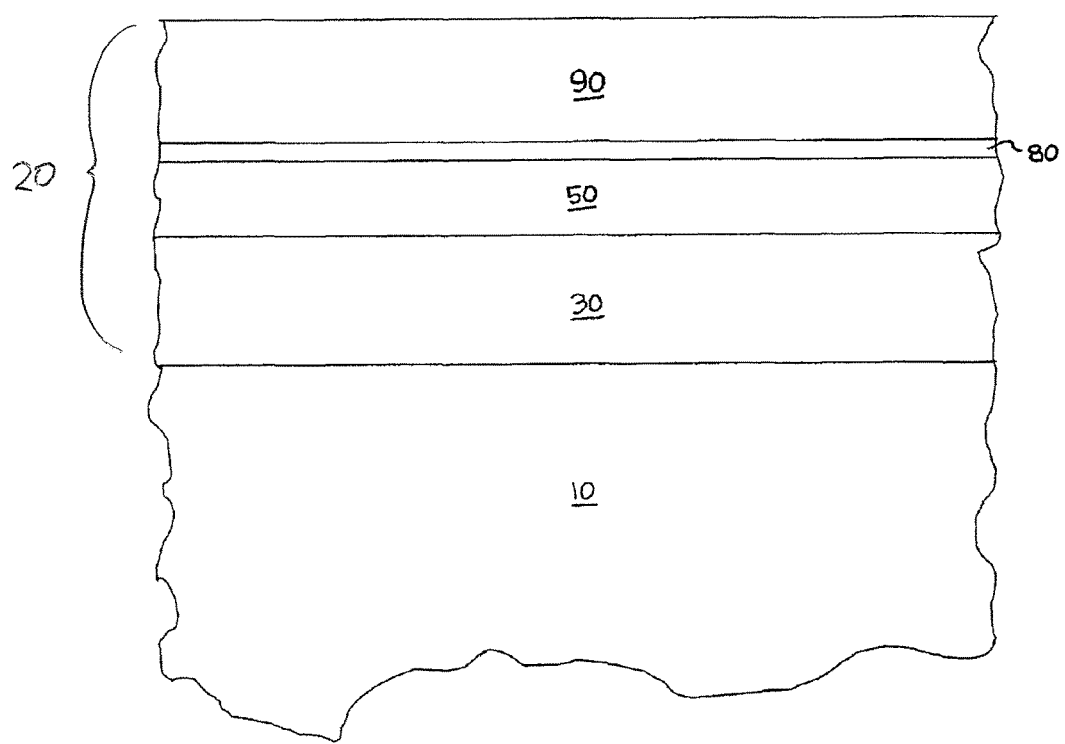
FIG. 1 is a schematic cross-sectional, broken-away view of a substrate having a surface coated with a low-emissivity coating in accordance with certain embodiments of the present invention.

In some embodiments, the invention provides a method of depositing a low-emissivity coating on a glazing sheet. The method involves depositing on the glazing sheet, in sequence moving outwardly from the glazing sheet, a transparent dielectric film, an infrared-reflective film, a nickel-aluminum blocker film, and an oxide film. The nickel-aluminum blocker film is deposited directly onto the infrared-reflective film, and the oxide film is deposited directly onto the nickel-aluminum blocker film.

Certain embodiments provide a glazing sheet and a low-emissivity coating on the glazing sheet. The low-emissivity coating comprises, in sequence moving outwardly from the glazing sheet, a layer comprising oxide film, nitride film, or oxynitride film, an infrared-reflective layer, a nickel-aluminum blocker layer, and an oxide layer. The nickel-aluminum blocker layer is in contact with the infrared-reflective layer, and the oxide layer is in contact with the nickel-aluminum blocker layer.

Some embodiments of the invention provide a glazing sheet and a low-emissivity coating on the glazing sheet. In the present embodiments, the low-emissivity coating comprises, in sequence moving outwardly from the glazing sheet, a base coat comprising at least one transparent dielectric film, a first infrared-reflective film, a first nickel-aluminum blocker film, a middle coat comprising at least one transparent dielectric film, a second infrared-reflective film, a second nickel-aluminum blocker film, and a top coat comprising at least one transparent dielectric film. In the present embodiments, the second infrared-reflective film is thicker than the first infrared-reflective film, in combination with the first nickel-aluminum blocker film being thicker than the second nickel-aluminum blocker film.

DETAILED DESCRIPTION

The following detailed description is to be read with reference to the drawings, in which like elements in different drawings have like reference numerals. The drawings, which are not necessarily to scale, depict selected embodiments and are not intended to limit the scope of the invention. Skilled artisans will recognize that the examples provided herein have many useful alternatives that fall within the scope of the invention.

The present invention provides coatings that include at least one nickel-aluminum film. The nickel-aluminum film has utility in a wide variety of coatings. Particular utility is provided for low-emissivity coatings, especially silver-based low-emissivity coatings (i.e., low-emissivity coatings that include at least one silver-containing infrared-reflective film). In some embodiments, the nickel-aluminum film is part of a heat-treatable (or heat treated, e.g., tempered) low-emissivity coating.

In some embodiments, the invention provides a low-emissivity coating 20 on a substrate (e.g., a glazing sheet) 10. Substrates suitable for use in connection with the present invention include the substrate class comprising flat, sheet-like substrates. A substrate of this nature has two opposed major surfaces (or "faces"). In most cases, the substrate will be a sheet of transparent material (i.e., a transparent sheet). The substrate may be a sheet of glass. One type of glass that is commonly used in manufacturing glass articles (e.g., insulating glass units) is soda-lime glass. Soda-lime glass will be a preferred substrate in many cases. Of course, other types of glass can be used as well, including those generally referred to as alkali-lime-silicon dioxide glass, phosphate glass, and fused silicon dioxide. It is to be appreciated that the substrate is not required to be transparent. For example, opaque substrates may be useful in some cases. However, it is anticipated that for most applications, the substrate will comprise a material that is transparent or translucent (i.e., to visible radiation), such as clear glass or clear plastic.

Substrates of various sizes can be used in the present invention. Commonly, large-area substrates are used. Certain embodiments involve a substrate having a length and/or width of at least 0.5 meter, preferably at least 1 meter, perhaps more preferably at least 1.5 meters (e.g., between 2 meters and 4 meters), and in some cases at least 3 meters. In some embodiments, the substrate is a jumbo glass sheet having a length and/or width that is between 3 meters and 10 meters, e.g., a glass sheet having a width of about 3.5 meters and a length of about 6.5 meters.

Substrates of various thicknesses can be used in the present invention. In some embodiments, the substrate (which can optionally be a glass sheet) has a thickness of 1-8 mm. Certain embodiments involve a substrate with a thickness of between 2 mm and 5 mm, such as between 2.3 mm and 4.8 mm, or between 2.5 mm and 4.8 mm. In one particular embodiment, a sheet of glass (e.g., soda-lime glass) with a thickness of about 3 is used.

With reference to FIG. 1, there is shown one embodiment of the invention involving a low-emissivity coating 20. Low-emissivity coatings are well known in the present art. Those skilled in this art would therefore be able to readily select and vary the precise nature (e.g., composition, thickness, and deposition process) of the various films in these coatings. Thus, the low-emissivity film stack embodiments described herein are merely exemplary.

In the embodiment of FIG. 1, the low-emissivity coating 20 has only one infrared-reflective film 50 (i.e., it is a "single" type low-emissivity coating). This film 50 can be formed of any desired infrared-reflective material. Silver is the most commonly used infrared-reflective material. However, gold, copper, or another infrared-reflective material can be used. Likewise, alloys or mixtures of these materials can be used. In many cases, it will be preferable to employ a silver or silver-containing film 50. For example, one may provide an infrared-reflective film 50 in the form of silver combined with a small amount (e.g., about 5% or less) of gold, platinum, or tin. Those skilled in the present art may prefer to use any of a number of other known types of silver-containing films. Moreover, if desired, film 50 may be a transparent conductive oxide (e.g., ITO) film or an electrically conductive nitride film (e.g., TiN).

With respect to low-emissivity coatings that have only a single infrared-reflective film, the thickness of this film 50 is preferably at least 50 angstroms to provide a desirable level of infrared reflectivity. A lesser thickness, however, may be suitable for certain applications. Typically, it is advantageous to select the thickness and material of the infrared-reflective film 50 so as to provide infrared reflectance values of above 60%, and more preferably above 85% (in the 3 to 10 micron range). In some cases, the coating 20 is designed to achieve infrared reflectance values as close as possible to 100%, while still providing the desired level of visual transmission. In certain embodiments, the infrared-reflective film 50 comprises silver at a thickness of between 50 angstroms and 190 angstroms, such as from 70 angstroms to 150 angstroms. As one example, silver at a thickness of about 75-135 angstroms is expected to give good results for certain applications.

Oxygen is preferably prevented from coming into reactive contact with the infrared-reflective film. Thin silver films, for example, are known to be highly sensitive to all forms of energy, and as they are not wetting dielectric surfaces, they may disintegrate and form islands. Exposure to impact by energetic ions (e.g., of oxygen), which can originate from the sputtering process of applying the immediately overlying antireflection film, can damage the fresh silver film. To prevent this, thin metal films (sometimes referred to as "sacrificial layers" or "blocker layers") are coated on top of the silver film with low power. This forms a stronger bond to the silver film and keeps the silver material from de-wetting and clustering. To bond this thin metal film strongly to the immediately overlying dielectric layer, part of the metal blocker layer preferably is reacted (e.g., oxidized) to form a strong bond with the immediately overlying dielectric layer. Preferably, there is no well-defined, sharp (e.g., "discrete") interface between the metallic and reacted portions of the blocker layer. In the past, some blocker layers have been made sputtering by sputtering titanium metal on top of a silver layer, and the titanium was partially reacted (e.g., oxidized) by residual gases or so called crosstalk from adjacent reactive sputtering stations that are not perfectly controlled. As the power and sputtering speed were low (for depositing the thin blocker layer), the degree of reaction (e.g., oxidation) and the thickness of the reacted portion was not well controlled. The thickness of the remaining metallic part will impact both the coating's absorption of light and the mechanical cohesion at the interface, as well as influencing mechanical and chemical properties of the final product.

The present nickel-aluminum film is particularly well suited for simultaneously: i) preventing oxygen from reaching and reacting with an underlying metallic infrared-reflective film, ii) adhering strongly to both the underlying metallic infrared-reflective film (in some embodiments, due to a non-reacted nickel component) and an overlying oxide film (e.g., due to its more easily reacted aluminum component), iii) providing the low-emissivity coating with particularly good mechanical durability, iv) providing the low-emissivity coating with exceptional moisture resistance, and v) enabling good control over optical properties (e.g., visible transmission) of the low-emissivity coating. Applicant has discovered that with the present Ni/Al blocker film(s), after completing the sputtering process and any subsequent heat-treatment in air, the targeted amount of remaining nickel metal is largely independent from the minute, difficult to control changes in coater vacuum conditions.

Aluminum reacts readily with oxygen, particularly at elevated temperatures, to form aluminum oxide (i.e., "alumina"). Nickel tends to be less reactive with oxygen. It is therefore postulated that when a nickel-aluminum film is deposited directly over (i.e., so as to be in contact with) an underlying silver layer and directly under (i.e., so as to be in contact with) an overlying oxide layer, aluminum in an upper portion of the blocker film becomes oxidized or more oxidized (perhaps fully oxidized), while nickel in a lower portion of the layer remains metallic or in substoichiometric form. Preferably, nickel at the interface with the underlying silver film remains metallic, as does the silver film itself. This appears to provide an exceptional bond with both the underlying metallic film and the overlying oxide film. While the foregoing mechanism is believed to contribute to the exceptional properties achieved by the present coatings, this explanation is not intended to be binding.

The nickel-aluminum blocker film is believed to be capable of chemically reacting with, and thus capturing, oxygen to form oxides of the nickel-aluminum. The nickel-aluminum film may also suppress the mobility of silver atoms during any heat-treatment. In such cases, the nickel-aluminum film may help maintain a continuous silver film.

It is surmised that when a film stack including oxide and/or nitride films is heated to glass tempering temperatures, the excess oxygen and/or nitrogen in these films may become mobile, and at such high temperatures are very reactive. It is thought that such highly reactive oxygen and/or nitrogen can be captured by one or more nickel-aluminum blocker films. As described in U.S. Pat. No. 6,919,133, conventional glass tempering is commonly performed in an oxidizing atmosphere (e.g., air). The teachings of this '133 patent are hereby incorporated herein insofar as they describe (see Example 1) a conventional glass tempering process, wherein glass is treated at elevated temperatures reaching about 734 C. It is also surmised that reactive oxygen from the atmosphere may penetrate the film stack during tempering. In such cases, this reactive oxygen may also be captured by the nickel-aluminum blocker film(s).

In the embodiment of FIG. 1, a nickel-aluminum blocker film 80 is formed upon an infrared-reflective film 50. In some cases, the nickel-aluminum film is deposited as a metallic (i.e., elemental metal) film. Such film can be sputtered, for example, from one or more metallic (e.g., alloy) targets onto the infrared-reflective film 50 in an inert atmosphere (e.g., argon). If desired, one or more nickel-aluminum targets can be sputtered. Alternatively, a metallic aluminum target can be co-sputtered with a nickel alloy target. The thus coated substrate may then be conveyed into a subsequent oxygen-containing sputtering zone (e.g., where a subsequent oxide film is deposited upon the nickel-aluminum film). As a result of this exposure, the nickel-aluminum film will typically become at least partially oxidized. Preferably, an outer portion of this layer (or at least aluminum therein) will become oxidized, while an inner portion (or at least nickel therein) remains metallic. Providing metallic nickel in the inner portion can impart additional absorption of visible radiation. In some applications, this is advantageous for providing controlled visible transmission levels, e.g., when low to medium levels of visible transmission are desired. The discussion in this paragraph applies for each nickel-aluminum blocker film in the coating.

In certain embodiments, the nickel-aluminum film is deposited as a sub-oxide (i.e., substoichiometric) film. If desired, the nickel-aluminum film, as deposited, can be substoichiometric across the entire thickness of the film. In some cases, a sub-oxide nickel-aluminum film is deposited by sputtering one or more sub-oxide nickel-aluminum targets onto the infrared-reflective film 50 in an inert atmosphere (e.g., argon). If desired, some oxygen, nitrogen, or both can be used in the sputtering atmosphere, but in an amount small enough to deposit the film as a sub-oxide. When provided, the sub-oxide nickel-aluminum target(s) can optionally include titanium sub-oxide, e.g., $TiO_x$, where x is less than 2. In other cases, a sub-oxide nickel-aluminum film is deposited by sputtering one or more metallic nickel-aluminum targets onto the infrared-reflective film 50 in an oxidizing atmosphere wherein the amount and/or reactivity of oxygen is controlled to deposit the film as a sub-oxide. In still other cases, separate targets formed respectively of nickel alloy and metallic aluminum are co-sputtered in a sub-oxidizing atmosphere (wherein the amount and/or reactivity of oxygen is controlled to deposit the film as a sub-oxide). If desired, one or each of the co-sputtered targets may include titanium. Regardless of which deposition method is used, the thus coated substrate may then be conveyed into a subsequent oxygen-containing sputtering zone (e.g., where a subsequent oxide film is deposited upon the sub-oxide nickel-aluminum film). As a result of this exposure, the sub-oxide film will become further oxidized. Preferably, an outer portion of this layer (or at least aluminum therein) will become more oxidized (optionally fully oxidized), while an inner portion (or at least nickel therein) remains less oxidized (e.g., substoichiometric). It has been discovered that the specific combination of nickel and aluminum in sub-oxide form can provide particularly good durability. This can be especially advantageous for laminated glass embodiments (e.g., where both the low-emissivity coating and a polymer interlayer are sandwiched between two glass panes, such that there is no air space between the two panes). The discussion in this paragraph applies for each nickel-aluminum blocker film in the coating.

It is to be understood that the term "nickel-aluminum" is used herein to refer to any compound that includes at least some nickel and at least some aluminum. Included in this definition is any alloy or mixture comprising both nickel and aluminum, whether metallic (i.e., elemental metal) or in the form of an oxide, a nitride, an oxynitride, etc., and optionally including one or more other desired materials. In some embodiments, nickel and aluminum are the only metals dispersed along the entire thickness of the nickel-aluminum blocker film. For example, the nickel-aluminum film can optionally be free of (i.e., devoid of) metals other than nickel and aluminum. If desired, the nickel-aluminum can consist essentially of (or consist of) metallic nickel and metal aluminum, optionally together with reaction products (e.g., oxides, nitrides, oxynitrides, etc.) thereof. In some cases, the nickel-aluminum consists essentially of (or consists of) nickel, aluminum, and oxygen and/or nitrogen. Again, the discussion in this paragraph applies for each nickel-aluminum blocker film in the coating.

Preferably, the nickel-aluminum blocker film contains (and/or is deposited as film containing) more than 7.5% aluminum by weight. Additionally or alternatively, the film can optionally contain (and/or be deposited as film containing) less than 30% aluminum by weight. Thus, the blocker film can advantageously contain (and/or be deposited as film containing) aluminum at a weight percentage of between 7.5% and 30%, such as between 7.5% and 25%, or between 7.5% and 15%, e.g., about 10%, with the remainder optionally being nickel. In one embodiment, the nickel-aluminum film is deposited as film containing about 90% nickel and about 10% aluminum. In embodiments where the nickel-aluminum film comprises oxygen, nitrogen, or both, the foregoing percentages are on a metal-only basis. Here again, the discussion in this paragraph applies for each nickel-aluminum blocker film in the coating.

In certain embodiments, the nickel-aluminum film also includes titanium. In such cases, the relative amounts of nickel, aluminum, and titanium can be varied depending upon the particular application, the properties desired, etc. When provided, the titanium can be present in the nickel-aluminum film in metallic form, stoichiometric oxide form, and/or sub-oxide form. The discussion in this paragraph applies for each nickel-aluminum blocker film in the coating.

In certain embodiments, the nickel-aluminum blocker film is a single layer blocker coating. In some cases, it is deposited in metallic form, in which case it may optionally consist essentially of (or consist of) nickel and aluminum, or it may consist essentially of (or consist of) nickel, aluminum and titanium. In such cases, the nickel-aluminum blocker film preferably is sandwiched directly between (i.e., so as to contact both) an underlying infrared-reflective film (e.g., a silver layer) and an overlying oxide film. In other embodiments, a nickel-aluminum blocker film is deposited directly over an infrared-reflective film, a titanium-containing film is deposited directly over the nickel-aluminum blocker film, and a transparent dielectric (e.g., an oxide film) is deposited directly over the titanium-containing film. This can optionally be the case for any one or more (e.g., all) blocker films in the coating. The titanium-containing film can be a titanium sub-oxide film, titanium dioxide, or an outer portion of the film can comprise $TiO_2$ while an inner portion comprises titanium sub-oxide, metallic titanium, or both. The titanium-containing film can also contain nickel and aluminum.

In still other embodiments, a titanium-containing film is deposited directly over an infrared-reflective film, a nickel-aluminum blocker film is deposited directly over the titanium-containing film, and a transparent dielectric (e.g., an oxide film) is deposited directly over the nickel-aluminum blocker film. This can optionally be the case for one or more (e.g., all) blocker films in the coating. The titanium-containing film can be a titanium sub-oxide film or a titanium dioxide film, or an outer portion of the film can be $TiO_2$ while an inner portion is titanium sub-oxide. The titanium-containing film can also contain nickel and aluminum.

The nickel-aluminum blocker film has a thickness designed to protect the neighboring (e.g., underlying or overlying) infrared-reflective film and to control the optical properties (e.g., visible transmission) desired for the coated substrate. Generally, the thickness of the nickel-aluminum blocker film is between 10 angstroms and 90 angstroms.

In certain embodiments, the thickness of the nickel-aluminum film is selected such that following a desired heat treatment (e.g., tempering) and the associated conversion of some of the aluminum, and possibly some of the nickel, to an oxide, there remains a portion (e.g., the innermost portion) of the nickel-aluminum film that is not significantly oxidized. This inner portion may be metallic, or at least essentially non-oxidized. The blocker layer thickness, for example, can be selected such that the innermost portion remains metallic. In such cases, the unreacted portion will typically be (or include) that portion of the nickel-aluminum film that is contiguous to a directly underlying infrared-reflective film. The discussion in this paragraph applies for each nickel-aluminum blocker film in the coating.

In the embodiment of FIG. 1, the nickel-aluminum film 80 is positioned over the outer face (i.e., the face oriented away from the substrate) of the infrared-reflective film 50. Preferably, this nickel-aluminum film 80 is positioned directly over (i.e., is in contact with) the underlying infrared-reflective film 50.

With continued reference to the embodiment of FIG. 1, a base coat 30 is formed upon one of the two major surfaces of the substrate 10. The base coat 30 includes one or more transparent dielectric films. It is to be understood that the term "transparent dielectric" is used herein to refer to any non-metallic (e.g., neither a pure metal nor a metal alloy) compound film that includes any one or more metals and has a visible transmission of at least 50% when provided at a thickness of 300 angstroms or less. Included in this definition would be any film of metal oxide, metal nitride, metal oxynitride, metal carbide, metal sulfide, metal boride, or any combination thereof having visible transmission in the specified range. Further, the term "metal" should be understood to include all metals and semi-metals (i.e., metalloids). Preferably, each transparent dielectric film is an oxide, nitride, or oxynitride.

The base coat 30 preferably has an overall thickness of between about 85 angstroms and about 700 angstroms, and more preferably between 100 angstroms and 600 angstroms, such as from 120 angstroms to 550 angstroms. The base coat 30 may comprise one or more transparent dielectric materials. For example, a wide variety of metal oxides may be used, including oxides of zinc, tin, indium, bismuth, titanium, hafnium, zirconium, and alloys and mixtures thereof. While metal oxides are sometimes preferred due to their ease and low cost of application, metal nitrides (e.g., silicon nitride) and oxynitrides (e.g., silicon oxynitride) can also be used advantageously. Those skilled in the present art would be able to readily select other materials that could be used for the base coat 30.

The base coat 30 in the embodiment of FIG. 1 is depicted as being a single film. However, it can alternatively comprise a plurality of films. For example, the base coat 30 may include two separate films, optionally formed of different transparent dielectric materials. If the base coat 30 consists of a single film, it preferably comprises zinc oxide. In one example, the base coat 30 is a single zinc tin oxide film applied at a thickness of about 350 angstroms.

As has been described, the composition of the base coat 30 can be varied as desired. However, it is generally preferred that at least a thin film comprising zinc oxide be applied as the outermost portion (i.e., the portion farthest away from the substrate) of this layer. As noted above, this is believed to enhance the quality of the film stack, at least if the overlying infrared-reflective film 50 is formed of silver. Zinc oxide-based films have been found to provide a good foundation for the nucleation of silver. Thus, it is preferable either to form the whole of the base coat 30 of film comprising zinc oxide or to form it of two or more films wherein the outermost film comprises zinc oxide.

A variety of film stacks are known to be suitable for use as the base coat of a "single" type low-emissivity coating. For example, the first film (i.e., the film nearest the substrate) may be tin oxide, titanium dioxide, silicon nitride, or an alloy or mixture of zinc oxide, such as an alloy or mixture of zinc oxide and bismuth oxide, tin oxide, or indium oxide. As noted above, the second film preferably comprises zinc oxide (such as pure zinc oxide, zinc tin oxide, or zinc aluminum oxide), at least if the overlying infrared-reflective film 50 is formed of silver. While the relative thicknesses of these two films can be varied as desired, the combined thickness of both films is preferably between 85 angstroms and 700 angstroms, such as from 120 angstroms to 550 angstroms. Those skilled in the art would be able to readily select a variety of other suitable film stacks to use as the base coat 30.

In the embodiment of FIG. 1, the second illustrated film 50 is the infrared-reflective film, and the third illustrated film 80 is the nickel-aluminum blocker film. Both of these films 50, 80 have already been discussed. An outer film region 90 is desirably positioned over the nickel-aluminum film 80. In its simplest form, the outer film region 90 consists of a single transparent dielectric layer (e.g., an oxide layer) applied at a thickness of between about 85 angstroms and about 700 angstroms, such as from 300 angstroms to 600 angstroms. Useful materials for this layer include silicon nitride and oxides of zinc, tin, indium, bismuth, titanium, hafnium, zirconium, and alloys and mixtures thereof. Skilled artisans would be able to select other suitable materials and thicknesses for the outer layer of a low-emissivity coating.

If desired, the outer film region 90 can be formed by a plurality of separate films. A variety of film stacks are known to be suitable for use as the outer film region of a "single" type low-emissivity coating. In one example, the outer film region 90 is formed of the following two layers: (1) zinc tin oxide applied at a thickness of about 350 angstroms directly upon the nickel-aluminum blocker film 80; and (2) silicon nitride applied at a thickness of about 110 angstroms directly upon the preceding zinc tin oxide layer. This example is by no means limiting.

Figure 2:
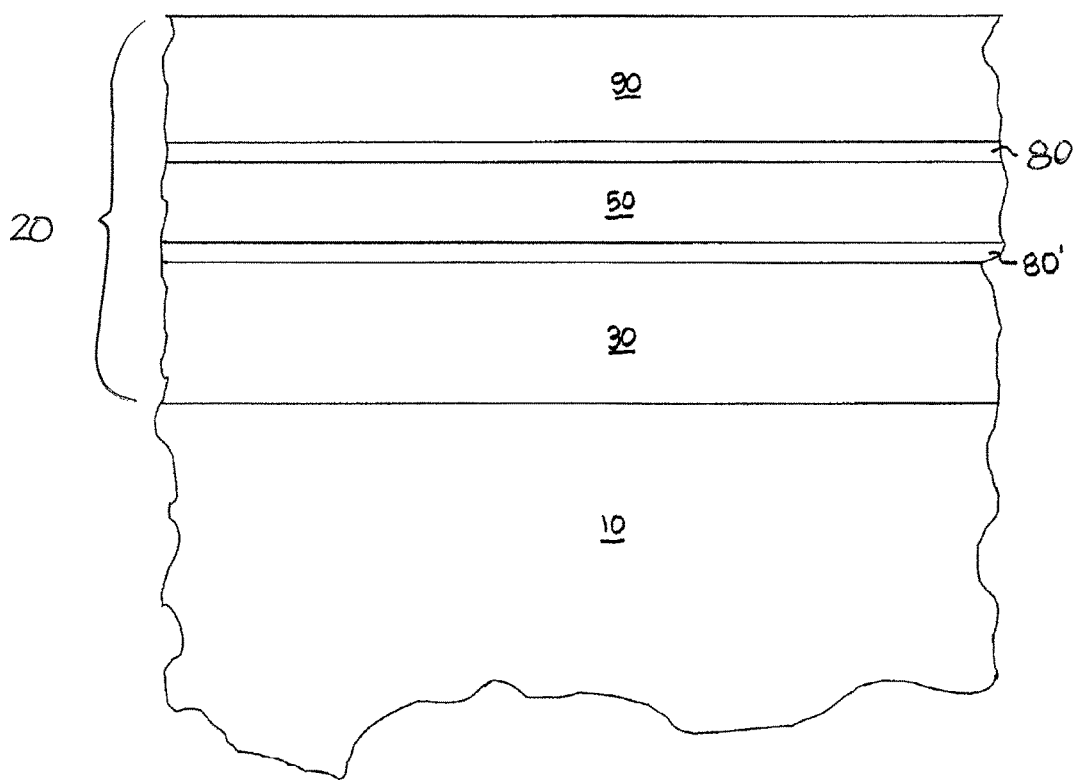
FIG. 2 is a schematic cross-sectional, broken-away view of a substrate having a surface coated with a low-emissivity coating in accordance with other embodiments of the invention.

FIG. 2 illustrates an embodiment of the invention wherein two protective nickel-aluminum films 80, 80' are positioned respectively under and over the infrared-reflective film 50 in a "single" type low-emissivity coating. In this embodiment, the infrared-reflective film 50 is sandwiched directly between (i.e., so as to contact) two nickel-aluminum films 80, 80'. When provided, the nickel-aluminum film 80' beneath the infrared-reflective film 50 may optionally be thinner than the nickel-aluminum layer 80 over the infrared-reflective film 50. Additionally or alternatively, the nickel-aluminum film 80' beneath the infrared-reflective film 50 may optionally be oxidized to a greater extent than the nickel-aluminum layer 80 over the infrared-reflective film 50. For example, the nickel-aluminum film directly under an infrared-reflective layer may be oxidized (e.g., may have sub-oxide film) over its entire thickness, while the nickel-aluminum film directly over that infrared-reflective layer may have only an outer portion that is oxidized (the rest may be metallic). Thickness arrangements and/or relative oxidation states of the noted type may prevent undue reduction in transmissivity. Sandwiching an infrared-reflective film 50 (e.g., one formed of silver) directly between two nickel-aluminum layers 80, 80' may provide a great deal of protection for the infrared-reflective film 50 together with particularly good durability. While FIG. 2 depicts a "single" type low-emissivity coating, one or more (optionally each) of the infrared-reflective films in a "double" or "triple" type low-emissivity coating can be provided with such an arrangement of two nickel-aluminum films 80, 80'.

Thus, the present coatings have at least one nickel-aluminum blocker film and may be "single," "double," or "triple" type low-emissivity coatings (i.e., they may have one, two, or three IR-reflective films. If desired, the coating may even have four or more such films. In preferred embodiments, though, the coating 20 has only 1-3 IR-reflective films.

Figure 3:
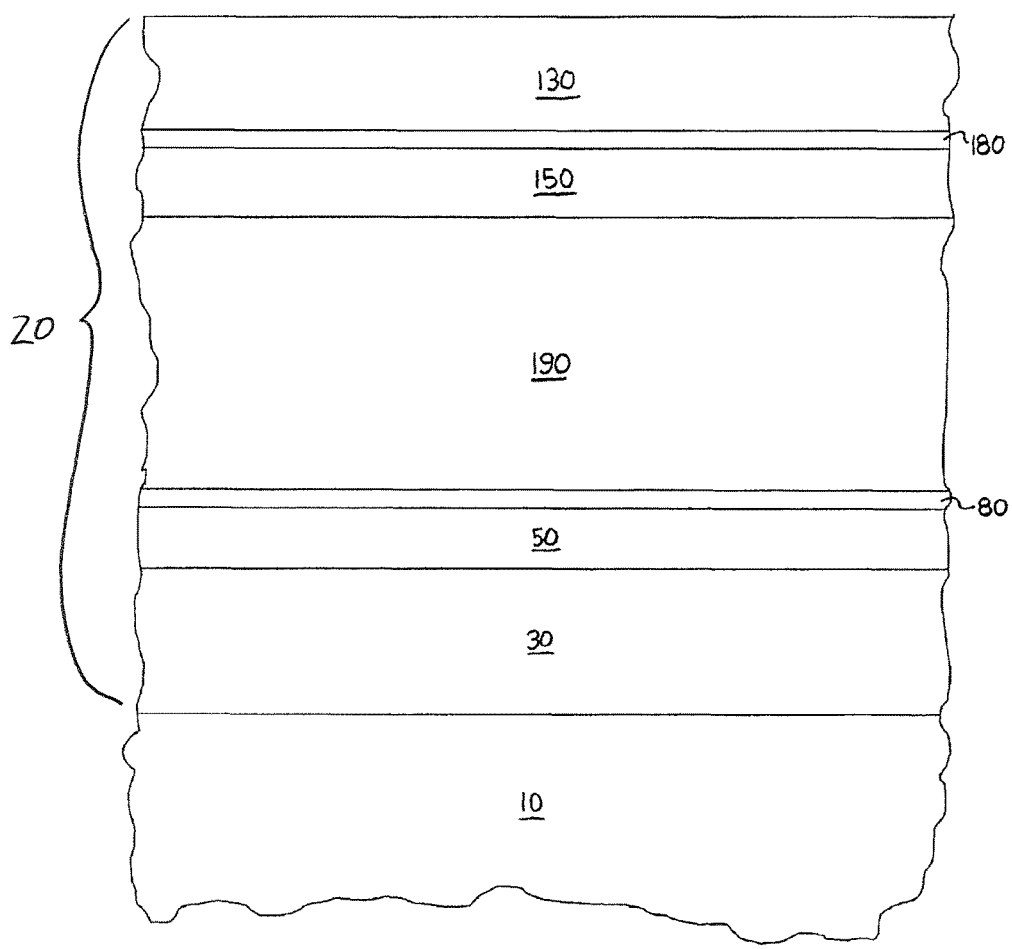
FIG. 3 is a schematic cross-sectional, broken-away view of a substrate having a surface coated with a low-emissivity coating in accordance with still other embodiments of the invention.

FIG. 3 depicts another embodiment of the invention. This embodiment involves a low-emissivity film stack having two infrared-reflective films 50, 150. In this film stack, a base coat 30 is formed on the substrate 10. Preferably, this base coat 30 has an overall thickness of between 100 angstroms and 600 angstroms, such as between 150 angstroms and 550 angstroms. As with the base coat 30 described above with reference to FIG. 1, the base coat 30 in the present embodiment may include one or more transparent dielectric films. For example, this base coat 30 may advantageously comprise a metal nitride (e.g., silicon nitride), metal oxynitride (e.g., silicon oxynitride), and/or a metal oxide, such as oxides of zinc, tin, indium, bismuth, titanium, hafnium, zirconium, and alloys and mixtures thereof. Skilled artisans would be able to select other materials that could be used for the base coat 30 in this embodiment.

The base coat 30 in the embodiment of FIG. 3 is depicted as a single film. However, it can alternatively comprise a plurality of separate films, if so desired. For example, the base coat 30 may include two separate films, optionally formed of different transparent dielectric materials. If the base coat 30 in this embodiment consists of a single film, such film preferably comprises zinc oxide. For example, this base coat 30 may be single film of zinc tin oxide applied at a thickness of about 330 angstroms.

As has been described, the composition of the base coat 30 in the embodiment of FIG. 3 can be varied as desired. However, it is generally preferred that at least a thin film comprising zinc oxide be applied as the outermost portion (i.e., the portion farthest away from the substrate) of the base coat 30. This is believed to enhance the quality of the film stack, at least if the overlying infrared-reflective film 50 is formed of silver, as zinc oxide-based film is thought to provide a good foundation for the nucleation of silver. Thus, it is preferable either to form the whole of the base coat 30 of film comprising zinc oxide or to form it of two or more films (not shown), wherein the outermost film comprises zinc oxide.

A variety of film stacks are known to be suitable for use as the base coat of a "double" type low-emissivity coating. For example, the first film (i.e., the film nearest the substrate) may be tin oxide, titanium oxide, silicon nitride, silicon dioxide, or an alloy or mixture of zinc oxide, such as an alloy or mixture of zinc oxide and bismuth oxide, tin oxide, or indium oxide. As connoted above, the second film preferably comprises zinc oxide (e.g., pure zinc oxide, zinc tin oxide, or zinc aluminum oxide), at least if the overlying infrared-reflective film 50 is formed of silver. One suitable embodiment of this nature involves a first film comprising silicon dioxide at a thickness of about 130 angstroms and a second film comprising zinc tin oxide at a thickness of about 230 angstroms.

The second layer 50 illustrated in FIG. 3 is an infrared-reflective film. The infrared-reflective materials described above with reference to FIG. 1 can also be used for the infrared-reflective films 50, 150 in the embodiment of FIG. 3. In most cases, it will be preferable to employ silver or silver-containing film 50, 150. In one embodiment, the first infrared-reflective film 50 comprises silver at a thickness of between 50 angstroms and 150 angstroms, such as about 80 angstroms.

A nickel-aluminum blocker film 80 is provided over the first infrared-reflective film 50. The nickel-aluminum films 80, 180 shown in FIG. 3 can be of the nature described above. For example, the first nickel-aluminum film 80 can optionally be formed directly upon the first infrared-reflective film 50. The thickness of the first nickel-aluminum film 80 preferably is in the range of about 10-90 angstroms, such as about 70 angstroms.

With continued reference to FIG. 3, an intermediate film region 190 is positioned outwardly from (i.e., further from the substrate than) the first infrared-reflective film 50 (e.g., on the first blocker film 80). In its simplest form, this intermediate film region 190 consists of a single layer of any desired transparent dielectric material. For example, a single transparent dielectric film (e.g., zinc tin oxide) can be used at a thickness of about 400-1,200 angstroms, such as about 720 angstroms.

Alternatively, two or more separate transparent dielectric films can be positioned between the infrared-reflective layers 50, 150. These films preferably have a combined thickness of about 400-1,200 angstroms.

Thus, in a low-emissivity coating having at least two infrared-reflective films, the innermost infrared-reflective film preferably is directly followed, moving outwardly, by a contiguous sequence of a nickel-aluminum blocker film and a metal oxide film (e.g., zinc tin oxide). If desired, one or more additional films can be provided between the metal oxide film and the second infrared-reflective film.

FIG. 3 depicts a "double" type low-emissivity coating. Thus, a second infrared-reflective film 150 is provided. The materials useful in forming the first infrared-reflective film 50 are also useful in the forming second infrared-reflective film 150. In most cases, both infrared-reflective films 50, 150 will be formed of the same material, although this is not a requirement. Preferably, both films 50, 150 are silver or silver-containing films, with the second (and outermost) IR-reflective film 150 being thicker than the first (and innermost) IR-reflective film 50. One embodiment provides a first infrared-reflective film 50 of silver at a thickness in the range of 70-100 angstroms, such as about 80 angstroms, and a second infrared-reflective film 150 of silver at a thickness in the range of 100-130 angstroms, such as about 110 angstroms. Another embodiment provides a first infrared-reflective film 50 of silver at a thickness in the range of 100-130 angstroms, such as about 120 angstroms, and a second infrared-reflective film 150 of silver at a thickness in the range of 140-170 angstroms, such as about 160 angstroms.

As illustrated in FIG. 3, a nickel-aluminum film 180 can advantageously be provided over the second infrared-reflective film 150. This nickel-aluminum film 180 can be of the nature described above. For example, this film 180 can optionally be formed directly upon the underlying infrared-reflective film 150. Further, the thickness of this nickel-aluminum film 180 is preferably in the range of about 10-90 angstroms, such as about 55 angstroms. Thus, in some embodiments, both blocker films 80, 180 are nickel-aluminum films, each deposited at a thickness of about 10-90 angstroms.

In certain embodiments, the coating 20 includes two blocker films having different thicknesses. For example, one of the nickel-aluminum blocker films can be at least 10% thicker, or at least 20% thicker, than another of the nickel-aluminum blocker films. In some double-type Low-E coating embodiments, two nickel-aluminum blocker films 80, 180 are deposited such that a first 80 of the two nickel-aluminum blocker films is located closer to the glazing sheet than is a second 180 of the two nickel-aluminum blocker films, and the first nickel-aluminum blocker film 80 is thicker than the second nickel-aluminum blocker film 180. In addition, the second IR-reflective film 150 can advantageously be thicker than the first IR-reflective film 50. Several exemplary film stacks of this nature are detailed below. In such cases, the first nickel-aluminum blocker film 80 preferably is at least 10% thicker than the second nickel-aluminum blocker film 180. In some embodiments of this nature, the first nickel-aluminum blocker film 80 is at least 50% thicker, or at least 75% thicker, than the second nickel-aluminum blocker film 180. When the first nickel-aluminum blocker film 80 is provided at a greater thickness than the second nickel-aluminum blocker film 180 (e.g., in any such embodiment described in this paragraph), the combined thickness of the two blocker films 80, 180 can advantageously be greater than 60 angstroms, such as from 60-150 angstroms.

In some triple-type Low-E coating embodiments, three nickel-aluminum blocker films 80, 180, 280 are deposited such that a first 80 of the nickel-aluminum blocker films is located closer to the glazing sheet than is a second 180 of the nickel-aluminum blocker films, while the second nickel-aluminum blocker film 180 is located closer to the glazing sheet than is a third 280 of the nickel-aluminum blocker films. In certain embodiments of this nature, the second 180 and third 280 nickel-aluminum blocker films are each at least 50% thicker than (e.g., between 50% and 300% thicker than), or at least 75% thicker than (e.g., between 75% and 300% thicker than), or even more than twice as thick as, the first nickel-aluminum blocker film 80. In some embodiments of this nature, the first nickel-aluminum blocker film 80 has (or is at least deposited at) a thickness of between 10 and 40 angstroms, while the second 180 and third 280 nickel-aluminum blocker films each have (or are at least deposited at) a thickness between 30 and 80 angstroms.

Referring now to FIG. 3, a nickel-aluminum layer (not shown) can be positioned directly beneath the second infrared-reflective layer 150, if so desired. Additionally or alternatively, a nickel-aluminum layer (not shown) can be positioned directly beneath the first infrared-reflective layer 50, if so desired. This can also the case for one, two, or all three of the IR-reflective layers 50, 150, 250 in the embodiment of FIG. 5.

In the embodiment of FIG. 3, an outer film region 130 is positioned outwardly from the second infrared-reflective film 150 (e.g., directly upon the second blocker film 180). The exact nature of the outer film region 130 can be varied as desired. In its simplest form, the outer film region 130 consists of a single transparent dielectric film. A wide variety of metal nitrides (e.g., silicon nitride), oxynitrides (e.g., silicon oxynitride), or metal oxides (e.g., oxides of zinc, tin, indium, bismuth, titanium, hafnium, zirconium, and alloys and mixtures thereof) can be used as the outermost layer of a low-emissivity coating. In one embodiment, the outer film region 130 is a single film (e.g., silicon nitride, tin oxide, or zinc tin oxide) having a thickness of between about 100 angstroms and about 600 angstroms, e.g., between 100 angstroms and 375 angstroms, such as about 295 angstroms.

It may be preferable to employ an outer film region 130 comprising a plurality of separate layers. For example, the outer film region 130 can comprise two separate layers. A first outer layer can be deposited directly upon the second blocker film 180. The first outer layer can be formed of any desired transparent dielectric material. For example, this layer can advantageously be formed of zinc tin oxide. The thickness of the first outer layer may range between 100 angstroms and 500 angstroms, e.g., between 100 angstroms and 250 angstroms, such as about 140 angstroms. A second outer layer can be deposited directly upon the first outer layer. While this layer can be formed of any desired transparent dielectric material, it is preferably formed of a chemically-durable material, such as silicon nitride. The thickness of the second outer layer is preferably between 50 angstroms and 300 angstroms, e.g., between 50 angstroms and 250 angstroms, such as about 200 angstroms. In one embodiment, the first outer layer is formed of zinc tin oxide at a thickness of about 140 angstroms, while the second outer layer is formed of silicon nitride at a thickness of about 200 angstroms. More generally, a variety of film stacks are known to be suitable for use as the outer film region of a "double" type low-emissivity coating.

Figure 4:
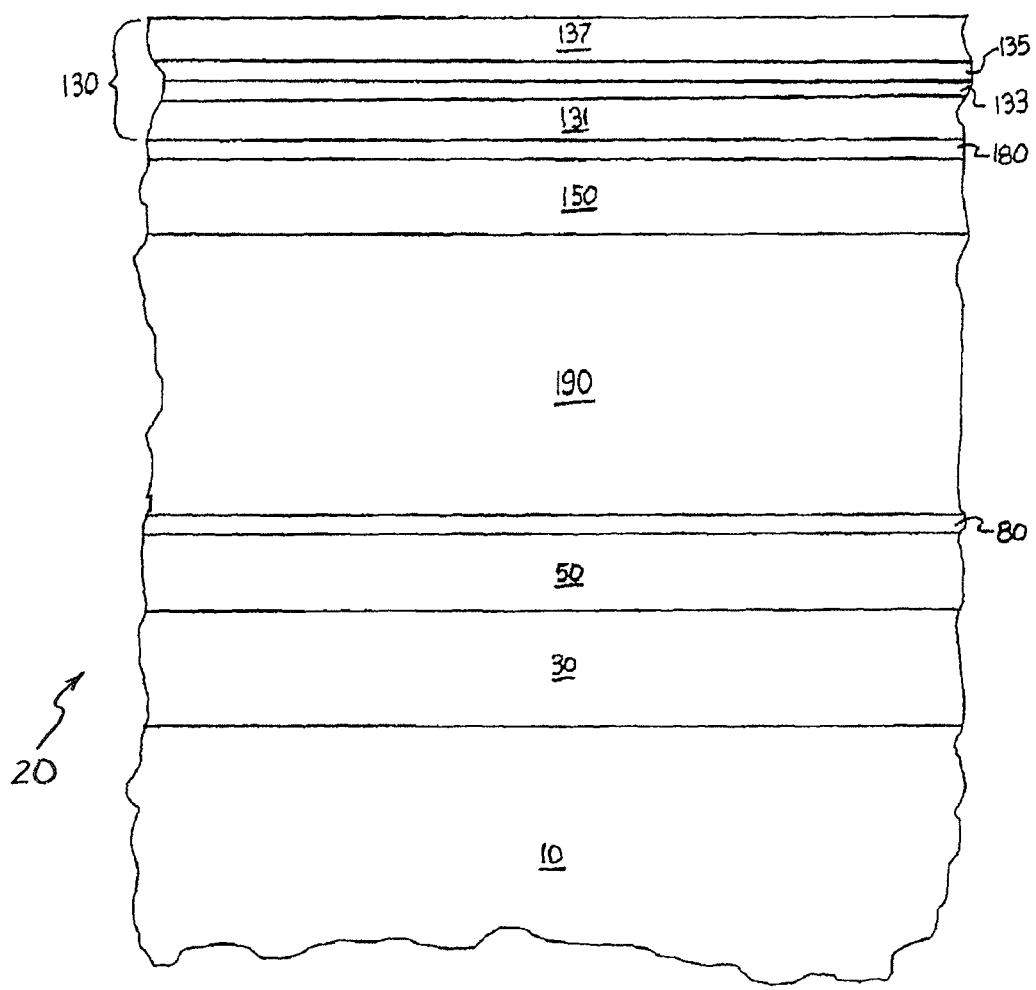
FIG. 4 is a schematic cross-sectional view of a substrate having a surface coated with a low-emissivity coating in accordance with yet other embodiments of the invention.

FIG. 4 shows an embodiment wherein the outer film region 130 comprises four layers. These layers 131, 133, 135, 137 can be formed of various materials. For example, directly upon the second protective layer 180 may be deposited a film layer 131 formed of an alloy or mixture of zinc oxide, such as an alloy or mixture of zinc oxide and bismuth oxide, tin oxide, or indium oxide. This film layer 131 is preferably deposited at a thickness of between 50 angstroms and 200 angstroms, such as about 150 angstroms. In this embodiment, a titanium nitride layer 135 can optionally be sandwiched between first 133 and second 137 layers comprising silicon nitride or silicon oxynitride, with this sandwich being located directly upon the film layer 131. In one example, the innermost 133 of these silicon nitride layers has a thickness of 25-150 angstroms, such as about 80 angstroms while the outermost 137 of these silicon nitride layers preferably has a thickness of 50-200 angstroms, such as about 120 angstroms. When provided, the titanium nitride layer 135 preferably has a thickness on the order of 5-55 angstroms, such as about 10 angstroms.

Figure 5:
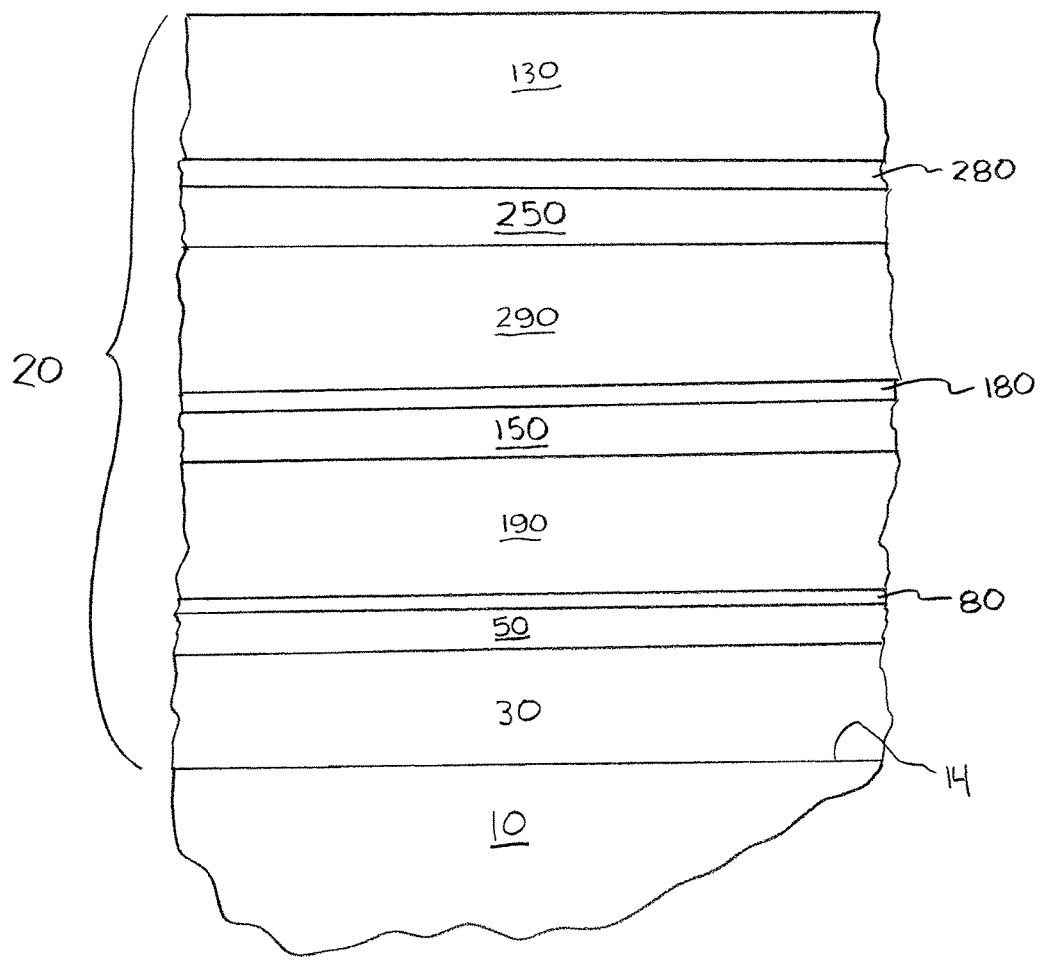
FIG. 5 is a schematic cross-sectional view of a substrate having a surface coated with a low-emissivity coating in accordance with still other embodiments of the invention.

Turning now to FIG. 5, there is shown an embodiment of the invention involving a multiple-cavity (or "triple-IR-layer-type") low-emissivity coating 20, i.e., a low-emissivity coating based on three infrared-reflective films 50, 150, 250. The materials described above with respect to the first 50 and second 150 IR-reflective films in the single and double type low-E coatings of FIGS. 1-4 can also be used for the third infrared-reflective film 250 in the triple type low-E coatings of FIG. 5. One example provides a first infrared-reflective layer 50 of silver at a thickness in the range of 100-150 angstroms, in combination with a second infrared-reflective layer 150 of silver at a thickness in the range of 120-180 angstroms, and a third infrared-reflective layer 250 of silver at a thickness in the range of 140-200 angstroms.

In FIG. 5, the coating 20 has three blocker films 80, 180, 280 provided respectively over the three IR-reflective films 50, 150, 250. The materials described above with respect to the first 80 and second 180 blocker films in the single and double type low-E coatings of FIGS. 1-4 can also be used for the third blocker film 280 in the triple type low-E coatings of FIG. 5. One example provides a first nickel-aluminum blocker film 80 at a thickness in the range of 10-40 angstroms, such as about 25 angstroms, in combination with a second nickel-aluminum blocker film 180 at a thickness in the range of 20-60 angstroms, such as about 45 angstroms, and a third nickel-aluminum blocker film 280 at a thickness in the range of 10-60 angstroms, such as about 50 angstroms.

In connection with the base coat 30 in the embodiment of FIG. 5, the materials described above with respect to the base coat 30 in the single and double type low-E coatings of FIGS. 1-4 can also be used for the base coat 30 of a triple type low-E coating like that shown in FIG. 5. The base coat 30 preferably has an overall thickness of between 150 angstroms and 600 angstroms, and more preferably between 200 angstroms and 600 angstroms, such as from 250 to 550 angstroms. The base coat 30 in the embodiment of FIG. 5 is depicted as being a single film. However, this base coat 30 can comprise a plurality of films, if so desired. In one example, the base coat 30 comprises a first film comprising silicon dioxide having a thickness of about 230 angstroms followed by a second film comprising zinc tin oxide having a thickness of about 195 angstroms. As with the base coats in the single and double type LowE coatings of FIGS. 1-4, a variety of film stacks are known to be suitable for use as the base coat of a triple type low-emissivity coating.

The coating in FIG. 5 has two spacer coats 190, 290. The first spacer coat 190 is provided between the first and second IR-reflective layers 50, 150, while the second spacer coat 290 is provide between the second and third IR-reflective layers 150, 250. In the simplest form, each of these two spacer coats 190, 290 consists of a single layer of a transparent dielectric material. For example, a single transparent dielectric film (e.g., zinc tin oxide) having a thickness of about 400-1,200 angstroms can be used for each spacer coat. In one example, the first spacer coat 190 is a single zinc tin oxide film having a thickness of 700-900 angstroms, such as about 835 angstroms, while the second spacer coat 290 is a single zinc tin oxide film having a thickness of 500-800 angstroms, such as about 685 angstroms. Alternatively, two or more separate transparent dielectric films can be used. More generally, a variety of film stacks are known to be suitable for use as the spacer coats of a triple type low-emissivity coating.

In the coating 20 of FIG. 5, an outer film region 130 is positioned outwardly from the third infrared-reflective film 250 (e.g., directly upon the third blocker film 280). The exact nature of the outer film region 130 can be varied as desired. In its simplest form, the outer film region 130 consists of a single transparent dielectric film. It may be preferable to use an outer film region 130 comprising a plurality of separate layers. For example, the outer film region 130 can consist of two transparent dielectric layers. In one example, a first outer layer is formed of zinc tin oxide at a thickness of about 270 angstroms, while a second outer layer is formed of silicon nitride at a thickness of about 260 angstroms. It will be appreciated, however, that a variety of film stacks are known to be suitable for use as the outer film region of a "triple-IR-layer-type" low-emissivity coating.

Given the teachings of the present disclosure, it will be appreciated that certain embodiments of the invention provide a low-emissivity coating having at least one infrared-reflective layer, wherein there is found a contiguous sequence of, moving outwardly, a zinc tin oxide film, a silver or silver-containing film, and a nickel-aluminum film. The silver or silver-containing film in this sequence is positioned directly over the zinc tin oxide film and directly beneath the nickel-aluminum layer. If desired, one or more additional films (e.g., comprising silicon nitride, silicon oxynitride, or silicon dioxide) can be provided inwardly from the zinc tin oxide film in this sequence (e.g., directly upon the glazing sheet or other substrate). Further, an oxide film preferably is positioned directly over the nickel-aluminum layer in the noted sequence. The silver or silver-containing film in this sequence may be the only infrared-reflective film in the coating, or it may be one of two or more infrared-reflective films in the coating.

One exemplary film stack in accordance with the invention will now be described. This embodiment involves a "double" type low-emissivity coating. The layers of this coating will be described in order, moving outwardly (i.e., in a direction away from the substrate). Directly upon the substrate, there is formed a layer comprising silicon dioxide. This layer preferably has a thickness of between 100 angstroms and 350 angstroms, such as about 130 angstroms. Directly upon this layer there is formed a layer of zinc tin oxide. The thickness of this zinc tin oxide layer is preferably between 70 angstroms and 350 angstroms, such as about 230 angstroms. An infrared-reflective silver layer is formed directly upon this zinc tin oxide layer. This silver layer preferably has a thickness of between 75 angstroms and 110 angstroms, such as about 85 angstroms. A metallic nickel-aluminum film is then applied directly upon this silver layer. In the present example, the nickel-aluminum layer is deposited as metallic nickel-aluminum film. Some of the nickel-aluminum is oxidized during the deposition of an overlying oxide layer, as described above. This nickel-aluminum blocker film is preferably deposited at a thickness of between 50 angstroms and 90 angstroms, such as about 70 angstroms. Directly upon this nickel-aluminum layer is applied a layer of zinc tin oxide, which preferably has a thickness of between 500 angstroms and 900 angstroms, such as about 720 angstroms. An infrared-reflective silver layer is formed directly upon this zinc tin oxide layer. This silver layer preferably has a thickness of between 80 angstroms and 140 angstroms, such as about 110 angstroms. A metallic nickel-aluminum blocker film is then applied directly upon this silver layer. This nickel-aluminum film preferably is deposited at a thickness of between 30 angstroms and 80 angstroms, such as about 55 angstroms. Directly upon this nickel-aluminum film is applied a layer of zinc tin oxide, which preferably has a thickness of between 50 angstroms and 100 angstroms, such as about 75 angstroms. Directly upon this zinc tin oxide layer is deposited a layer comprising silicon nitride, which preferably forms the outermost layer of the film stack. Preferably, this silicon nitride layer has a thickness of between 100 angstroms and 300 angstroms, such as about 205 angstroms. Given the present teaching as a guide, those skilled in the present art would be able to readily select and many other suitable layer compositions and thicknesses that are outside these ranges yet produce good results.

Another exemplary film stack in accordance with the invention will now be described. This embodiment also involves a "double" type low-emissivity coating. The layers of this coating will be described in order, moving outwardly. Directly upon the substrate, there is a layer comprising silicon nitride. This layer preferably has a thickness of between 100 angstroms and 350 angstroms, such as about 250 angstroms. Directly upon this layer there is formed a layer of zinc tin oxide. The thickness of this zinc tin oxide layer is preferably between 90 angstroms and 300 angstroms, such as about 190 angstroms. An infrared-reflective silver layer is applied directly upon this zinc tin oxide layer. This silver layer preferably has a thickness of between 100 angstroms and 185 angstroms, such as about 135 angstroms. A metallic nickel-aluminum blocker film is then applied directly upon this silver layer. This nickel-aluminum layer preferably is deposited at a thickness of between 30 angstroms and 70 angstroms, such as about 50 angstroms. Directly upon this nickel-aluminum layer is applied a layer of zinc tin oxide. This zinc tin oxide layer preferably is deposited at thickness of between 600 angstroms and 1,100 angstroms, such as about 855 angstroms. An infrared-reflective silver film is formed directly upon this zinc tin oxide layer. This silver film preferably has a thickness of between 110 angstroms and 170 angstroms, such as about 140 angstroms. A metallic nickel-aluminum blocker film is deposited directly upon this silver layer. This nickel-aluminum film is preferably deposited at a thickness of between 15 angstroms and 40 angstroms, such as about 25 angstroms. Directly upon this nickel-aluminum film is applied a layer of zinc tin oxide. This zinc tin oxide film preferably has a thickness of between 100 angstroms and 190 angstroms, such as about 150 angstroms. A layer comprising silicon nitride is then deposited directly upon this zinc tin oxide layer. This film comprising silicon nitride preferably has a thickness of between 50 angstroms and 100 angstroms, such as about 80 angstroms. A layer of titanium nitride is then formed directly upon this layer comprising silicon nitride. This titanium nitride layer preferably has a thickness of between 5 angstroms and 15 angstroms, such as about 10 angstroms. Directly upon this titanium nitride layer is applied a layer comprising silicon nitride. This layer comprising silicon nitride preferably has a thickness of between 90 angstroms and 150 angstroms, such as about 120 angstroms. This film is the outermost layer of the film stack.

Still another exemplary film stack in accordance with the invention will now be described. The layers of this coating, which is also a "double" type low-emissivity coating, will be described in order, moving outwardly. Directly upon the substrate, there is a layer comprising silicon nitride. This layer preferably has a thickness of between 100 angstroms and 350 angstroms, such as about 250 angstroms. Directly upon this layer is applied a layer of zinc tin oxide. The thickness of this zinc tin oxide layer is preferably between 90 angstroms and 300 angstroms, such as about 190 angstroms. An infrared-reflective silver layer is applied directly upon this zinc tin oxide layer. This silver layer preferably has a thickness of between 100 angstroms and 185 angstroms, such as about 120 angstroms. A metallic nickel-aluminum blocker film is then applied directly upon this silver layer. This nickel-aluminum layer preferably is deposited at a thickness of between 20 angstroms and 70 angstroms, such as about 40 angstroms. Directly upon this nickel-aluminum layer is applied a layer of zinc tin oxide. This zinc tin oxide layer preferably is deposited at thickness of between 600 angstroms and 1,100 angstroms, such as about 825 angstroms. An infrared-reflective silver film is formed directly upon this zinc tin oxide layer. This silver film preferably has a thickness of between 110 angstroms and 190 angstroms, such as about 160 angstroms. A metallic nickel-aluminum blocker film is applied directly upon this silver layer. This nickel-aluminum film is preferably deposited at a thickness of between 15 angstroms and 40 angstroms, such as about 25 angstroms. Directly upon this nickel-aluminum film is applied a layer of zinc tin oxide. This zinc tin oxide film preferably has a thickness of between 130 angstroms and 220 angstroms, such as about 180 angstroms. A layer comprising silicon nitride is then deposited directly upon this zinc tin oxide layer. This film comprising silicon nitride preferably has a thickness of between 120 angstroms and 290 angstroms, such as about 180 angstroms. This film is the outermost layer of the film stack.

Yet another exemplary film stack in accordance with the invention will now be described. The layers of this coating, which is a "triple" type low-emissivity coating, will be described in order, moving outwardly. Directly upon the substrate, there is a layer comprising silicon dioxide. This layer preferably has a thickness of between 100 angstroms and 350 angstroms, such as about 230 angstroms. Directly upon this layer is applied a layer of zinc tin oxide. The thickness of this zinc tin oxide layer is preferably between 90 angstroms and 400 angstroms, such as about 260 angstroms. An infrared-reflective silver layer is applied directly upon this zinc tin oxide layer. This silver layer preferably has a thickness of between 100 angstroms and 185 angstroms, such as about 130 angstroms. A metallic nickel-aluminum blocker film is then applied directly upon this silver layer. This nickel-aluminum layer preferably is deposited at a thickness of between 10 angstroms and 50 angstroms, such as about 15 angstroms. Directly upon this nickel-aluminum layer is applied a layer of zinc tin oxide. This zinc tin oxide layer preferably is deposited at thickness of between 600 angstroms and 1,100 angstroms, such as about 850 angstroms. An infrared-reflective silver film is formed directly upon this zinc tin oxide layer. This silver film preferably has a thickness of between 110 angstroms and 190 angstroms, such as about 165 angstroms. A metallic nickel-aluminum blocker film is applied directly upon this silver layer. This nickel-aluminum film is preferably deposited at a thickness of between 15 angstroms and 60 angstroms, such as about 35 angstroms. Directly upon this nickel-aluminum film is applied a layer of zinc tin oxide. This zinc tin oxide film preferably has a thickness of between 100 angstroms and 900 angstroms, such as about 675 angstroms. A third infrared-reflective silver film is formed directly upon this zinc tin oxide layer. This silver film preferably has a thickness of between 110 angstroms and 230 angstroms, such as about 175 angstroms. A metallic nickel-aluminum blocker film is applied directly upon this silver layer. This nickel-aluminum film is preferably deposited at a thickness of between 15 angstroms and 70 angstroms, such as about 40 angstroms. Directly upon this nickel-aluminum film is applied a layer of zinc tin oxide. This zinc tin oxide film preferably has a thickness of between 50 angstroms and 300 angstroms, such as about 225 angstroms. A layer comprising silicon nitride is then deposited directly upon this zinc tin oxide layer. This film comprising silicon nitride preferably has a thickness of between 120 angstroms and 280 angstroms, such as about 215 angstroms. This film is the outermost layer of the film stack.

Still another exemplary film stack in accordance with the invention will now be described. The layers of this coating, which is a "triple" type low-emissivity coating, will be described in order, moving outwardly (i.e., in a direction away from the substrate). Directly upon the substrate, there is formed a layer comprising silicon dioxide. This layer preferably has a thickness of between 100 angstroms and 350 angstroms, such as about 230 angstroms. Directly upon this layer there is formed a layer of zinc tin oxide. The thickness of this zinc tin oxide layer is preferably between 70 angstroms and 350 angstroms, such as about 195 angstroms. An infrared-reflective silver layer is formed directly upon this zinc tin oxide layer. This silver layer preferably has a thickness of between 75 angstroms and 150 angstroms, such as about 115 angstroms. A metallic nickel-aluminum film is then applied directly upon this silver layer. In the present example, the nickel-aluminum layer is deposited as metallic nickel-aluminum film. Some of the nickel-aluminum is oxidized during the deposition of an overlying oxide layer, as described above. This nickel-aluminum blocker film is preferably deposited at a thickness of between 10 angstroms and 90 angstroms, such as about 25 angstroms. Directly upon this nickel-aluminum layer is applied a layer of zinc tin oxide, which preferably has a thickness of between 400 angstroms and 1,200 angstroms, such as about 835 angstroms. An infrared-reflective silver layer is formed directly upon this zinc tin oxide layer. This silver layer preferably has a thickness of between 80 angstroms and 220 angstroms, such as about 165 angstroms. A metallic nickel-aluminum blocker film is then applied directly upon this silver layer. This nickel-aluminum film preferably is deposited at a thickness of between 30 angstroms and 80 angstroms, perhaps optimally about 50 angstroms. Directly upon this nickel-aluminum film is applied a layer of zinc tin oxide, which preferably has a thickness of between 400 angstroms and 1,200 angstroms, such as about 680 angstroms. Directly upon this zinc tin oxide layer is deposited an infrared-reflective silver layer. This silver layer preferably has a thickness of between 80 angstroms and 220 angstroms, such as about 170 angstroms. A metallic nickel-aluminum blocker film is then applied directly upon this silver layer. This nickel-aluminum film preferably is deposited at a thickness of between 30 angstroms and 80 angstroms, such as about 50 angstroms. Directly upon this nickel-aluminum film is applied a layer of zinc tin oxide, which preferably has a thickness of between 50 angstroms and 350 angstroms, such as about 270 angstroms. Directly upon this zinc tin oxide layer is deposited a layer comprising silicon nitride, which preferably forms the outermost layer of the film stack. Preferably, this silicon nitride layer has a thickness of between 100 angstroms and 300 angstroms, such as about 260 angstroms.

One aspect of the invention provides methods of depositing a nickel-aluminum blocker film. The nickel-aluminum film can be deposited advantageously by sputter deposition (i.e., sputtering). Sputtering techniques and equipment are well known in the present art. For example, magnetron sputtering chambers and related equipment are available commercially from a variety of sources (e.g., Von Ardenne GmbH, of Dresden, Germany, or Von Ardenne North America, Inc., of Perrysburg, Ohio, USA). Useful magnetron sputtering techniques and equipment are also disclosed in U.S. Pat. No. 4,166,018, issued to Chapin, the teachings of which are incorporated herein by reference.

Figure 6:
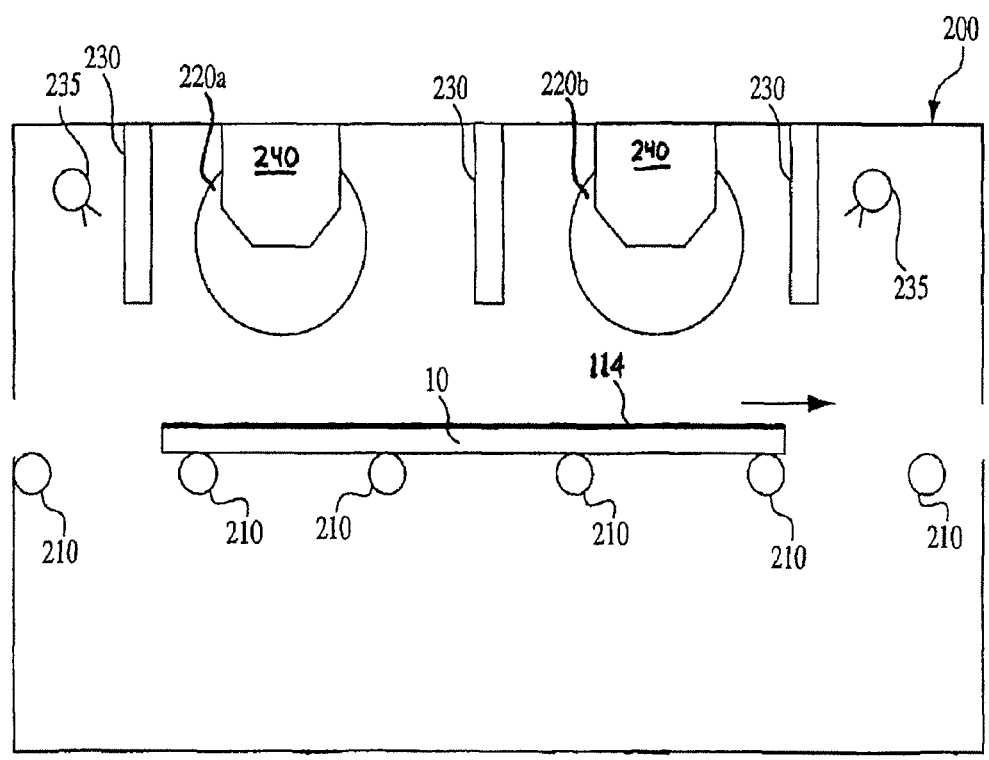
FIG. 6 is a schematic end view of a sputtering chamber that has utility in certain methods of the invention.

Thus, conventional magnetron sputtering techniques and equipment can be used to deposit the nickel-aluminum film. Techniques and equipment of this nature are best understood with reference to FIG. 6, wherein there is illustrated a sputtering chamber 200 equipped with two cathodes. Each cathode includes a sputtering target 220a, 220b, end blocks 240, and a magnet array (not shown) and cooling lines (not shown) within the target. While the illustrated chamber 200 is provided with two cathodes, it may be desirable to employ a single cathode instead. Also shown in FIG. 6 are anodes 230, gas distribution pipes 235, and transport rollers 210 for conveying the substrate 10 through the chamber 200. Sputtering equipment of this nature is well known in the present art.

The sputtering targets 220a, 220b illustrated in FIG. 6 are depicted as being cylindrical magnetron targets (i.e., C-Mags). However, any type of sputtering target (e.g., planar or cylindrical) can be used. For example, the sputtering chamber can alternatively be provided with a single planar target. The selection of appropriate planar and/or cylindrical targets is well within the purview of skilled artisans.

In one method of the invention, a nickel-aluminum film is deposited by sputtering one or more targets carrying target material comprising an alloy or mixture of nickel and aluminum. For example, the target material may comprise about 90% metallic nickel and about 10% metallic aluminum. The percentages of nickel and aluminum in the target material can be varied as desired. While the target material may consist (or consist essentially) of nickel and aluminum, it is anticipated that the target material may include one or more other materials in addition to nickel and aluminum (such as titanium and/or oxygen). Nickel-aluminum targets can be manufactured by Soleras Advanced Coatings BVBA, of Deinze, Belgium.

In another method of the invention, nickel-aluminum film is deposited by co-sputtering. Co-sputtering is a process in which two or more targets of different composition are sputtered simultaneously (or at substantially the same time). The nickel-aluminum film can be deposited by co-sputtering a nickel-containing target and an aluminum-containing target in the same sputtering chamber or zone. Thus, one of the targets 220a, 220b in the illustrated chamber 200 may be a nickel-containing target and the other may be an aluminum-containing target. For example, the targets 220a, 220b may be formed respectively of nickel compound (e.g., alloy) and metallic aluminum. Alternatively, the targets 220a, 220b may be formed respectively of a nickel compound and an aluminum compound. Nickel compound targets, as well as aluminum targets and aluminum compound targets, are available from a number of commercial suppliers, such as W. C. Heraeus of Hanau, Germany. The term "nickel-containing" is used herein to refer to any material that contains at least some nickel. The term "aluminum-containing" is used herein to refer to any material that contains at least some aluminum.

Thus, the present co-sputtering method comprises providing a nickel-containing target and an aluminum-containing target. Both targets are positioned in a sputtering chamber having a sputtering cavity in which a controlled environment can be established. One or more power supplies are provided for delivering electric charge (e.g., cathodic charge) to both targets. The cathodes are then energized to sputter nickel and aluminum onto a substrate, thereby depositing the nickel-aluminum film upon a layer previously deposited upon the substrate (e.g., onto a previously deposited infrared-reflective film, beneath which there may be other previously deposited films, as described above). The nickel-containing target and the aluminum-containing target may be sputtered at substantially the same time (e.g., simultaneously or in succession). A first power level is selected for delivery of electric charge to the nickel-containing target and a second power level is selected for delivery of electric charge to the aluminum-containing target. These power levels are selected to deposit desired percentages of nickel and aluminum. In certain preferred embodiments, the first power level is greater than the second power level.

Thus, preferred methods of the invention involve depositing the protective nickel-aluminum film by sputtering, whether conventionally or by co-sputtering. With continued reference to FIG. 6, there is provided a substrate 10 carrying a partial coating 114 that includes at least one infrared-reflective film. The infrared-reflective film will typically be positioned over a transparent dielectric film, and in most cases will define the outermost face of the partial coating 114 (prior to deposition thereon of the nickel-aluminum film). As will be obvious to those skilled in the art, one or more other films may be formed between the substrate and the transparent dielectric film and/or between the transparent dielectric film and the infrared-reflective film. For example, the partial coating 114 may take the form of the film stack portion beneath, and including, any one of the infrared-reflective films 50, 150, 250 depicted in FIGS. 1-5. In one particular method, the partial coating 114 includes an exposed outermost infrared-reflective silver or silver-containing film that is carried directly over a transparent dielectric film (e.g., zinc tin oxide or zinc aluminum oxide).

The partially coated substrate 10 is positioned beneath one or more targets 220a, 220b, which comprise both nickel and aluminum (either collectively or individually, depending on whether conventional sputtering or co-sputtering is used). As depicted in FIG. 6, the substrate 10 can be positioned upon a plurality of transport rollers 210. The target or targets are sputtered (i.e., energized) to deposit a nickel-aluminum film upon the partially-coated substrate (in many cases, directly upon the exposed infrared-reflective film). During sputtering, the substrate 10 can be conveyed through the chamber 200 (e.g., continuously and at constant speed). It is well known to drive (i.e., rotate) one or more of the rollers 210 to convey the substrate 10 through the chamber 200 (e.g., in the direction of the arrow shown in FIG. 6).

In some cases, it will be preferred to sputter the nickel-aluminum target or targets in a non-reactive (i.e., inert) atmosphere to deposit the nickel-aluminum film. This would be expected to yield a nickel-aluminum film that is as reactive as possible, thus enabling it to capture a great deal of oxygen and/or nitrogen during deposition of subsequent films and/or during heat treatment. In this regard, a sputtering atmosphere consisting essentially of noble gas (e.g., about 100% argon) may be preferred. For example, argon at a pressure of about $7 \times 10^{-3}$ mbar (or about 5 mtorr) should give good results. As will be appreciated by skilled artisans, the power used is selected based on the required thickness, the width of the coater, the coating speed, and the number of cathodes involved. Power levels of up to about 25 kW per target have been found to give good results in sputter depositing the nickel-aluminum film. Care should be taken to prevent accidental leakage (flow of reactive gases) into the area where the nickel-aluminum layer is sputtered under control. Any leak near the targets (at low power levels) could create local areas of oxidation in the nickel-aluminum film. This could create uniformity problems before and after tempering. The substrate 10 upon which the nickel-aluminum film is deposited can be conveyed through the sputtering chamber 200 at essentially any desired speed. For example, substrate speeds of between about 100-500 inches per minute should be suitable.

While sputtering techniques are presently contemplated to be preferred for depositing the protective nickel-aluminum film, other thin film deposition techniques can be used. For example, another useful method for depositing the present nickel-aluminum layer involves plasma chemical vapor deposition (i.e., CVD). Reference is made to U.S. Pat. No. 4,619,729 (Johncock et al.), U.S. Pat. No. 4,737,379 (Hudgens et al.), and U.S. Pat. No. 5,288,527 (Jousse et al.), the teachings of which are incorporated herein by reference. Plasma CVD involves decomposition of gaseous sources via a plasma and subsequent film formation onto solid surfaces, such as glass substrates. The thickness of the resulting film can be adjusted by varying the speed of the substrate as it passes through a plasma zone and by varying the power and gas flow rate within each zone. Those skilled in the art would be able to select other suitable deposition methods for applying the present nickel-aluminum layer.

While some preferred embodiments of the invention have been described, it should be understood that various changes, adaptations and modifications may be made therein without departing from the spirit of the invention and the scope of the appended claims.

What is claimed is:

1. A glazing sheet and a low-emissivity coating on the glazing sheet, the low-emissivity coating comprising, in sequence moving outwardly from the glazing sheet, a layer comprising oxide film, nitride film, or oxynitride film, a metallic infrared-reflective film, a nickel-aluminum blocker film, a titanium-containing film and an oxide film, the nickel-aluminum blocker film being in contact with the infrared-reflective film, the titanium-containing film being in contact with the nickel-aluminum blocker film and the oxide layer being in contact with the titanium-containing film, wherein the titanium-containing film has an outer interface and an inner interface, wherein the outer interface comprises titanium dioxide while the inner interface comprises metallic titanium and/or titanium sub-oxide, and the nickel-aluminum blocker film has an outer interface and an inner interface, the outer interface adheres to the titanium-containing film while the inner interface adheres to the metallic infrared-reflective film, and wherein the outer interface of the nickel-aluminum blocker film comprises aluminum oxide while the inner interface of the nickel-aluminum blocker film comprises metallic nickel.

2. The glazing sheet and low-emissivity coating of claim 1 wherein the nickel-aluminum blocker film is devoid of metals other than nickel and aluminum.

3. The glazing sheet and low-emissivity coating of claim 1 wherein the nickel-aluminum blocker film has a thickness of between 10 angstroms and 80 angstroms.

4. The glazing sheet and low-emissivity coating of claim 1 wherein the glazing sheet is a glass pane having a thickness in the range of 2 mm to 5 mm.

5. The glazing sheet and low-emissivity coating of claim 4 wherein the glass pane is soda-lime glass.

6. The glazing sheet and low-emissivity coating of claim 1 wherein the infrared-reflective film is at least 50% silver by weight.

* * * * *